(12) United States Patent
Lu et al.

(10) Patent No.: US 12,052,023 B1
(45) Date of Patent: Jul. 30, 2024

(54) FAST LOCKING DUAL LOOP CLOCK AND DATA RECOVERY CIRCUITS

(71) Applicant: QUALCOMM Incorporated, San Diego, CA (US)

(72) Inventors: Lejie Lu, San Diego, CA (US); Hao Liu, San Diego, CA (US); Yu Song, San Diego, CA (US); Dong Ren, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 18/158,662

(22) Filed: Jan. 24, 2023

(51) Int. Cl.
| H03L 7/18 | (2006.01) |
| H03L 7/093 | (2006.01) |
| H03L 7/099 | (2006.01) |
| H03L 7/187 | (2006.01) |

(52) U.S. Cl.
CPC .............. *H03L 7/187* (2013.01); *H03L 7/093* (2013.01); *H03L 7/0992* (2013.01)

(58) Field of Classification Search
CPC ........ H03L 7/187; H03L 7/093; H03L 7/0992
USPC .......................................................... 375/376
See application file for complete search history.

(56) References Cited

U.S. PATENT DOCUMENTS

| 6,803,827 | B1 * | 10/2004 | Kenney ................. | H03L 7/1075 |
| | | | | 331/11 |
| 10,027,332 | B1 * | 7/2018 | Wang .................... | H04L 1/0082 |
| 10,868,663 | B1 | 12/2020 | Turker Melek et al. | |
| 11,398,825 | B1 | 7/2022 | Eimitsu | |
| 11,469,877 | B1 * | 10/2022 | Raj ...................... | H04L 25/4917 |
| 2005/0200391 | A1 | 9/2005 | Steinbach et al. | |
| 2006/0104399 | A1 * | 5/2006 | Byun .................... | H03D 13/004 |
| | | | | 375/376 |
| 2007/0002993 | A1 | 1/2007 | Wang et al. | |
| 2008/0049884 | A1 * | 2/2008 | Kim ....................... | H03L 7/087 |
| | | | | 375/375 |

OTHER PUBLICATIONS

International Search Report and Written Opinion—PCT/US2023/082052—ISA/EPO—Apr. 8, 2024.
Razavi B., "Introduction to PLLs", Electrical Engineering Department, University of California, Los Angeles, Jan. 1, 2013, 30 pages, XP093145371, p. 19-p. 30.

* cited by examiner

*Primary Examiner* — Emmanuel Bayard
(74) *Attorney, Agent, or Firm* — Loza & Loza, LLP

(57) ABSTRACT

A clock recovery circuit includes a frequency tracking loop including a first charge pump, and a phase tracking loop including a second charge pump. A voltage-controlled oscillator responds to the frequency tracking loop in a first operating mode and to the phase tracking loop in a second operating mode. A lock detector outputs an activation signal that indicates whether the clock recovery circuit has acquired frequency lock. A loop filter coupled to an input of the voltage-controlled oscillator includes a switchable resistor and a programmable delay element responsive to the activation signal. The first charge pump is disabled when the activation signal indicates frequency lock has been acquired, and disabled when the activation signal indicates frequency lock has not been acquired. The switchable resistor is bypassed when an output of the programmable delay element is in the first signaling state.

30 Claims, 10 Drawing Sheets

FAST LOCKING DUAL LOOP CLOCK AND DATA RECOVERY CIRCUITS

The present disclosure generally relates to serial communication between integrated circuits and, more particularly, to efficient, fast clock recovery circuits using phase locked loops.

BACKGROUND

Electronic device technologies have seen explosive growth over the past several years. For example, growth of cellular and wireless communication technologies has been fueled by better communications, hardware, larger networks and more reliable protocols. Wireless service providers are now able to offer their customers an ever-expanding array of features and services, and provide users with unprecedented levels of access to information, resources, and communications. To keep pace with these service enhancements, mobile electronic devices (e.g., cellular phones, tablets, laptops, etc.) have become more powerful and complex than ever. Wireless devices may include a high-speed bus interface for communication of signals between hardware components.

High-speed serial buses offer advantages over parallel communication links when, for example, there is demand for reduced power consumption and smaller footprints in integrated circuit (IC) devices. In a serial interface, data is converted from parallel words to a serial stream of bits using a serializer and is converted back to parallel words at the receiver using a deserializer. For example, the high-speed bus interface may be implemented using a Peripheral Component Interconnect Express (PCIe) bus, Universal Serial Bus (USB) or Serial Advanced Technology Attachment (SATA), among others.

IC devices may include a serializer/deserializer (SERDES) to transmit and receive through a serial communication link. In some instance, the serial communication link is deployed between dice on a chip carrier. Increased capabilities and complexity of hardware and software functions implemented in IC devices has resulted in continuously increasing demand for higher data throughput with lower power consumption. There is an ongoing need for improved clock and data recovery circuits for use in high-speed serial links.

SUMMARY

Certain aspects of the disclosure relate to circuits, systems, apparatus, methods and techniques that support high speed serial communications within and between IC devices. A clock and data recovery circuit is disclosed. The disclosed CDR is implemented with a dual-loop sequential clock recovery circuit that provides proportional gain independently of an included voltage-controlled oscillator and that includes a bang-bang phase detection circuit.

In various aspects of the disclosure, a clock recovery circuit includes a frequency tracking loop including a frequency detector and a first charge pump; a phase tracking loop including a phase detector and a second charge pump; a voltage-controlled oscillator responsive to the frequency tracking loop in a first operating mode and responsive to the phase tracking loop in a second operating mode; a lock detector configured to output an activation signal that, in a first signaling state indicates that the clock recovery circuit has acquired frequency lock and, in a second signaling state indicates that the clock recovery circuit has not acquired frequency lock; and a loop filter coupled to an input of the voltage-controlled oscillator and including a switchable resistor and a programmable delay element responsive to the activation signal. In one example, the first charge pump is disabled when the activation signal is in the first signaling state, the second charge pump is disabled when the activation signal is in the second signaling state, and the switchable resistor is bypassed when an output of the programmable delay element is in the first signaling state.

In various aspects of the disclosure, a method for recovering a clock signal includes configuring a frequency tracking loop to include a frequency detector and a first charge pump; configuring a phase tracking loop to include a phase detector and a second charge pump; configuring a voltage-controlled oscillator to respond to the frequency tracking loop in a first operating mode and to respond to the phase tracking loop in a second operating mode; configuring a lock detector to output an activation signal that, in a first signaling state indicates that the clock recovery circuit has acquired frequency lock and, in a second signaling state indicates that the clock recovery circuit has not acquired frequency lock; and configuring a programmable delay element in a loop filter to respond to the activation signal, the loop filter being coupled to an input of the voltage-controlled oscillator. In one example, the first charge pump is disabled when the activation signal is in the first signaling state, the second charge pump is disabled when the activation signal is in the second signaling state, and a switchable resistor in the loop filter is bypassed when an output of the programmable delay element is in the first signaling state.

In various aspects of the disclosure, an apparatus includes means for tracking a frequency of a signal, including a frequency tracking loop that includes a frequency detector and a first charge pump; means for tracking phase of the signal, including a phase tracking loop that includes a phase detector and a second charge pump; means for generating a clock signal, including a voltage-controlled oscillator configured to respond to the frequency tracking loop in a first operating mode and to respond to the phase tracking loop in a second operating mode; means for detecting that the frequency tracking loop has acquired frequency lock, including a lock detector configured to output an activation signal that, in a first signaling state indicates that the clock recovery circuit has acquired frequency lock and, in a second signaling state indicates that the clock recovery circuit has not acquired frequency lock; and means for delaying the activation signal, including a programmable delay element provided in a loop filter that responds to the activation signal, the loop filter being coupled to an input of the voltage-controlled oscillator. In one example, the first charge pump is disabled when the activation signal is in the first signaling state, the second charge pump is disabled when the activation signal is in the second signaling state, and a switchable resistor in the loop filter is bypassed when an output of the programmable delay element is in the first signaling state.

In various aspects of the disclosure, a clock and data recovery circuit includes: a voltage-controlled oscillator; a first charge pump having an output coupled to a first control input of the voltage-controlled oscillator; a frequency detector having an input coupled to an output of the voltage-controlled oscillator and an output coupled to an input of the first charge pump; a frequency lock detector having a first input coupled to the output of the voltage-controlled oscillator, a second input that receives a reference clock signal, and an output that drives an enable input of the first charge pump; a second charge pump having an output coupled to the first control input of the voltage-controlled oscillator; a phase detector having an input that receives outputs from a plurality of data sampling circuits and a multibit output coupled to an input of the second charge pump and to a second control input of the voltage-controlled oscillator; and a loop filter coupled to the first control input of the voltage-controlled oscillator. The loop filter may include a tunable resistor; a programmable delay element triggered by the output of the frequency lock detector; and a switch that is configured to bypass the tunable resistor when indicated by an output of the programmable delay element. The data sampling circuits may be clocked by the output of the voltage-controlled oscillator.

In one aspect, the frequency detector is configured to provide the first charge pump a control signal that is representative of a difference in frequency between a reference clock signal and a divided output of the voltage-controlled oscillator. The control signal provided to the first charge pump may be configured to cause the first charge pump to configure a control voltage within the voltage-controlled oscillator.

In one aspect, the phase detector is configured to provide the second charge pump a control signal representative of a difference in phase between a data signal and an output of the voltage-controlled oscillator. The control signal provided to the second charge pump may be configured to cause the second charge pump to configure a control voltage within the voltage-controlled oscillator. The control signal provided to the second charge pump may also be provided directly to the voltage-controlled oscillator and is configured to tune the voltage-controlled oscillator.

In one aspect, the programmable delay element is configured with a delay configured to delay bypassing the switchable resistor until the clock recovery circuit has acquired phase lock. The switchable resistor may have a resistance value configured to increase a loop gain of the clock recovery circuit. The switchable resistor may have a resistance value that is configured or calibrated to obtain a desired proportional gain during transitions between the first operating mode and the second operating mode

DETAILED DESCRIPTION

Figure 1:
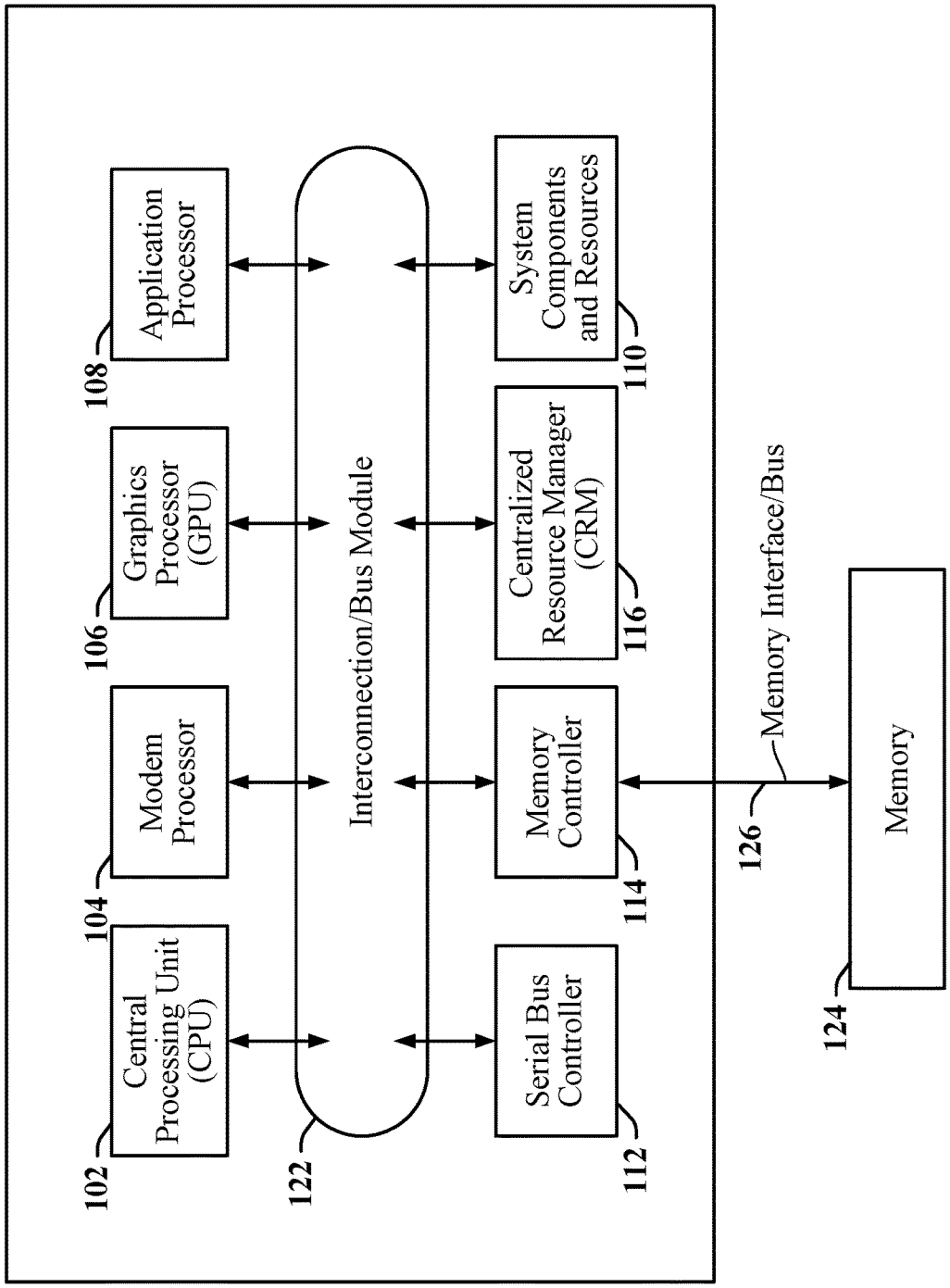
FIG. 1 illustrates an example of a system-on-a-chip (SOC) in accordance with certain aspects of the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

With reference now to the Figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

The terms "computing device" and "mobile device" are used interchangeably herein to refer to any one or all of servers, personal computers, smartphones, cellular telephones, tablet computers, laptop computers, netbooks, ultrabooks, palm-top computers, personal data assistants (PDAs), wireless electronic mail receivers, multimedia Internet-enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, size, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors (DSPs), modem processors, video processors, etc.), memory blocks (e.g., read only memory (ROM), random access memory (RAM), flash, etc.), and resources (e.g., timers, voltage regulators, oscillators, etc.), any or all of which may be included in one or more cores.

Memory technologies described herein may be suitable for storing instructions, programs, control signals, and/or data for use in or by a computer or other digital electronic device. Any references to terminology and/or technical details related to an individual type of memory, interface, standard, or memory technology are for illustrative purposes only, and not intended to limit the scope of the claims to a particular memory system or technology unless specifically recited in the claim language. Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.).

Process technology employed to manufacture semiconductor devices, including IC devices is continually improving. Process technology includes the manufacturing methods used to make IC devices and defines transistor size, operating voltages and switching speeds. Features that are constituent elements of circuits in an IC device may be referred as technology nodes and/or process nodes. The terms technology node, process node, process technology may be used to characterize a specific semiconductor manufacturing process and corresponding design rules. Faster and more power-efficient technology nodes are being continuously developed through the use of smaller feature size to produce smaller transistors that enable the manufacture of higher-density ICs.

FIG. 1 illustrates example components and interconnections in a system-on-chip (SoC) 100 that may be suitable for implementing certain aspects of the present disclosure. The SoC 100 may include a number of heterogeneous processors, such as a central processing unit (CPU) 102, a modem processor 104, a graphics processor 106, and an application processor 108. Each processor 102, 104, 106, 108, may include one or more cores, and each processor/core may perform operations independent of the other processors/cores. The processors 102, 104, 106, 108 may be organized in close proximity to one another (e.g., on a single substrate, die, integrated chip, etc.) so that the processors may operate at a much higher frequency/clock rate than would be possible if the signals were to travel off-chip. The proximity of the cores may also allow for the sharing of on-chip memory and resources (e.g., voltage rails), as well as for more coordinated cooperation between cores.

The SoC 100 may include system components and resources 110 for managing sensor data, analog-to-digital conversions, and/or wireless data transmissions, and for performing other specialized operations (e.g., decoding high-definition video, video processing, etc.). System components and resources 110 may also include components such as voltage regulators, oscillators, phase-locked loops (PLLs), peripheral bridges, data controllers, system controllers, access ports, timers, and/or other similar components used to support the processors and software clients running on the computing device. The system components and resources 110 may also include circuitry for interfacing with peripheral devices, such as cameras, electronic displays, wireless communication devices, external memory chips, etc.

The SoC 100 may further include a Universal Serial Bus (USB) or other serial bus controller 112, one or more memory controllers 114, and a centralized resource manager (CRM) 116. The SoC 100 may also include an input/output module (not illustrated) for communicating with resources external to the SoC, each of which may be shared by two or more of the internal SoC components.

The processors 102, 104, 106, 108 may be interconnected to the serial bus controller 112, the memory controller 114, system components and resources 110, CRM 116, and/or other system components via an interconnection/bus module 122, which may include an array of reconfigurable logic gates and/or implement a bus architecture. Communications may also be provided by advanced interconnects, such as high performance networks on chip (NoCs).

The interconnection/bus module 122 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 122 may implement an arbitration scheme to prevent multiple master components from attempting to drive the bus simultaneously. The memory controller 114 may be a specialized hardware module configured to manage the flow of data to and from a memory 124 via a memory interface/bus 126.

The memory controller 114 may be implemented using one or more processors configured to perform read and write operations with the memory 124. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In certain aspects, the memory 124 may be part of the SoC 100.

Figure 2:
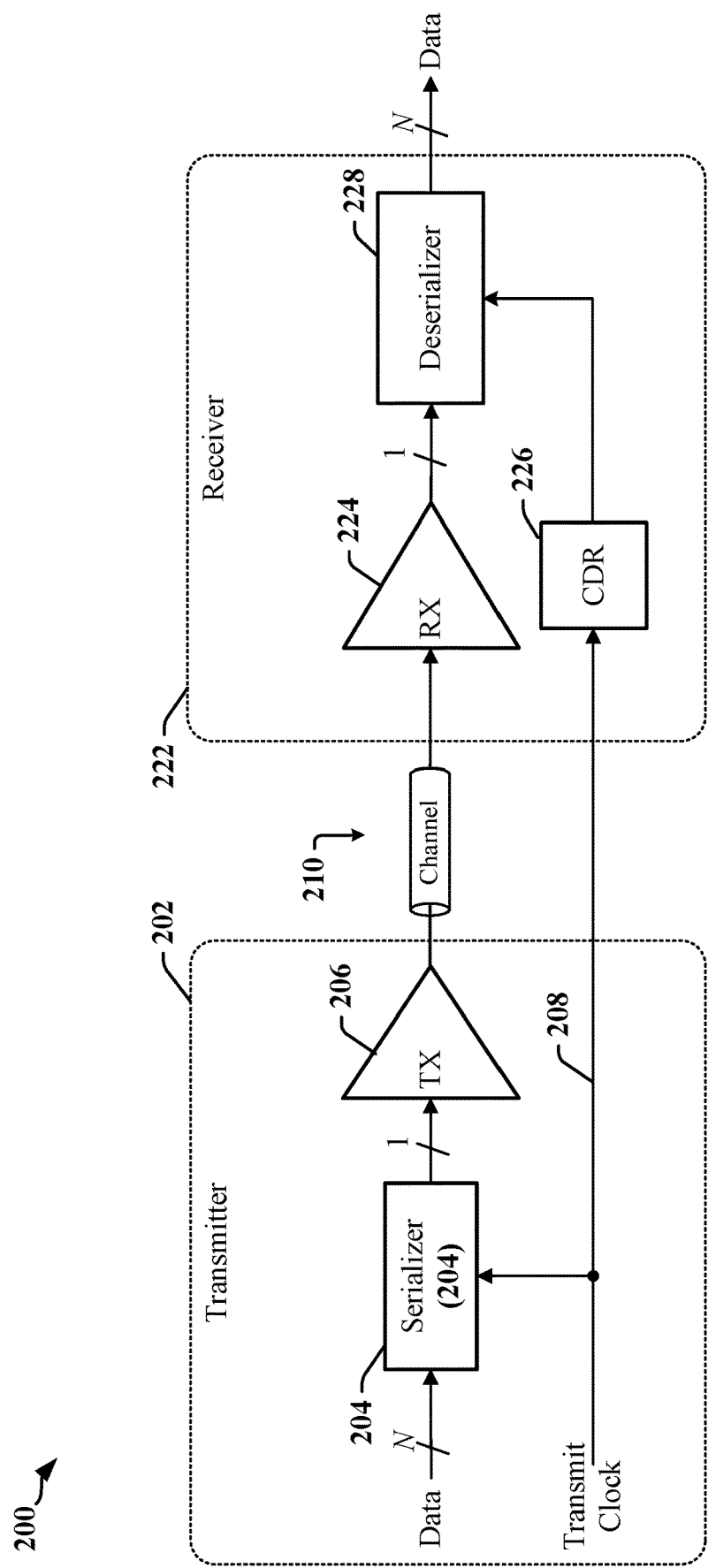
FIG. 2 illustrates an example of a data communication system that may be adapted in accordance with certain aspects of the present disclosure.

FIG. 2 illustrates an example of a data communication system 200 that may be adapted in accordance with certain aspects of the present disclosure. The data communication system 200 includes a transmitter 202, a data communication channel 210, and a receiver 222. The transmitter 202 may be provided in a first device that is configured to transmit a data signal to a second device. The data communication channel 210 provides a transmission medium through which the data signal propagates from the first device to the second device. The receiver 222 may be provided in the second device and may be configured to receive and process the data signal.

In one example, the transmitter 202 includes a serializer 204 configured to convert N-bit parallel data into a serial data stream. The transmitter 202 further includes a transmit driver 206 configured to generate a data signal representative of the serial data stream for transmission to the receiver 222 through the data communication channel 210.

The data communication channel 210 may be implemented using any type of transmission medium by which a data signal can propagate from the transmitter 202 to the receiver 222. Examples of the data communication channel 210 includes one or more metallization traces (which may include one or more vias) on a printed circuit board (PCB), stripline, microstrip, coaxial cable, twisted pair, etc. Certain aspects of this disclosure are applicable to serial communications between two dice provided on a chip-carrier. In some instances, the two dice may be coupled using a trace that has a length measurable as one or more millimeters. In some instances, the two dice may be coupled using a trace that has a length measurable as a fraction of a millimeter. In the latter example, the data communication channel 210 includes the millimeter-scale trace, input/output pads, interconnects, vias and traces within semiconductor devices.

The receiver 222 includes a receiving circuit (receiver 224), a clock data recovery circuit (the CDR 226) and a deserializer 228. In some implementations, the receiver 222 includes circuits configurable to perform equalization and amplification of the received data signal. Equalization circuits can boost the higher frequency components of a signal received from the data communication channel 210 in order to bring all frequency components of the signal to a similar amplitude and improve jitter. The CDR 226 is configured to receive a transmit clock signal 208 and to generate receive clock signals that can be used to sample or otherwise recover the serial data from the data signal based on information in the transmit clock signal 208. The CDR 226 may be configured to generate multiple signals from the transmit clock signal 208 received from the transmitter 202. The deserializer 228 is configured to convert the serial data back into parallel data.

The data signal or transmit clock signal 208 may be distorted when it arrives at the receiver 222. Distortion may arise for various reasons including impedance mismatches in the data communication channel 210, interference and reflected energy. Signal distortion can make it difficult to recover the clock and the data by the CDR 226 and can limit the window of stability during which data can be sampled. In some examples, distortion caused by high frequency attenuation can be addressed by equalization and amplification that increases the high frequency components of the data signal in order to increase the data rate at which the data signal may be sent through the data communication channel 210 and reliably recovered at the receiver 222. Distortion can produce timing errors and can introduce timing uncertainty or jitter that can compromise data the operation of the deserializer 228.

Improvements in semiconductor device technology and ever-increasing demand for performance in mobile communication devices and other battery-powered devices often necessitates increased data communication rates between IC devices. Increased data communication rates that are obtained through increased data transmission rates can significantly increase power consumption and decrease the maximum or rated operating time between battery charging events. A general-purpose serial link architecture consumes approximately 1 picoJoule per bit (pJ/bit) in the 10-20 gigabit per second (Gbps) data rate range. Certain aspects of this disclosure can deliver high data rate communication at lower power levels, including in data communication links that can be used for a die-to-die communication links within the same package.

In some aspects of the disclosure, power consumption can be reduced by limiting the number of logic and driver devices that switch at the highest clock frequencies employed by a communication interface. In some aspects of the disclosure, the frequency of the clock signal transmitted between IC devices can be less than the frequency at which data bits are transmitted over a serial bus.

Figure 3:
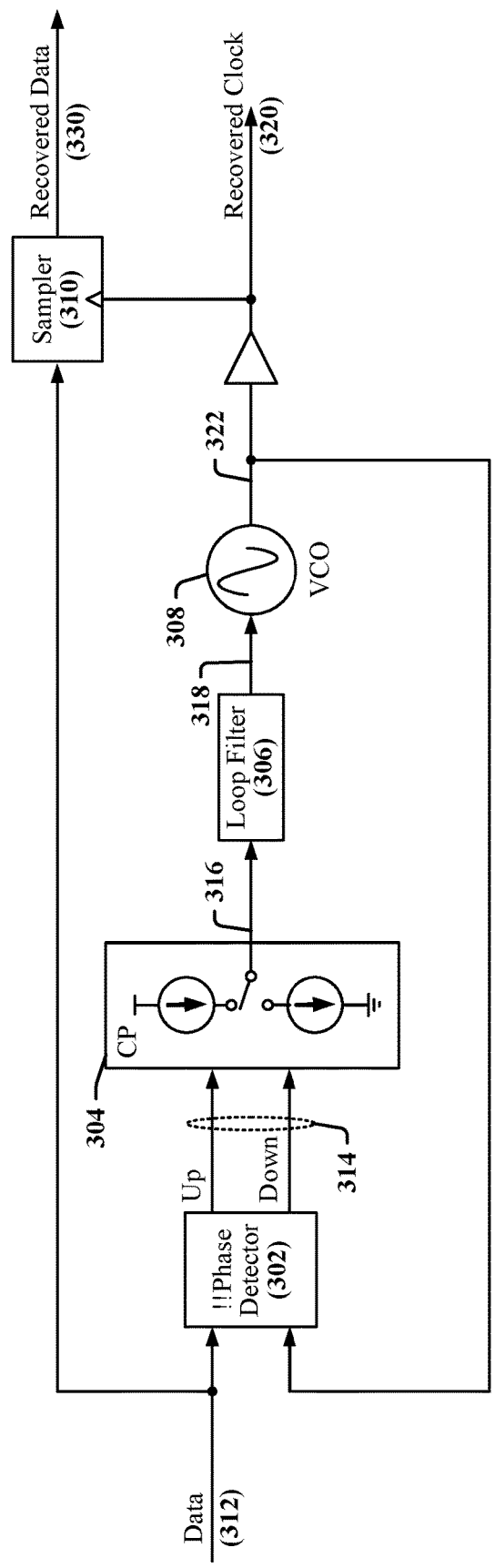
FIG. 3 illustrates a PLL-based closed loop clock and data recovery (CDR) circuit.

FIG. 3 illustrates an example of a closed loop clock and data recovery (CDR) circuit 300 that is based on a phase-locked loop (PLL). The CDR circuit 300 may be provided in a receiver such as the receiver 222 of the data communication system 200 illustrated in FIG. 2 in order to synchronize a received data signal 312 with a local reference clock signal. In the illustrated CDR circuit 300, the received data signal 312 may be encoded as an analog non-return-to-zero (NRZ) signal, which is input to a phase detector 302. The phase detector 302 may be a bang-bang phase detector, which may be indicated in the drawings as a "!!Phase Detector". A bang-bang phase detector compares the phase of two input signals and provides an output which distinguishes positive and negative phase differences between the input signals. In some implementations, the phase detector can be configured to provide an output that indicates a matching, leading or lagging phase relationship between the input signals. In some implementations, the phase detector can be configured to provide an output that includes control signals that can be used to tune a voltage-controlled oscillator (the VCO 308), phase interpolator or other circuit that can outputs a signal configurable frequency or phase relationship with a reference signal.

The phase detector 302 in the illustrated CDR circuit 300 may be configured to track the phase of the received data signal 312 and generate an output that can serve as up and down signals 314. The up and down signals 314 are provided to a charge pump 304 and can have the effect of increasing, decreasing or maintaining a level of the output of the charge pump 304. The charge pump 304 generates a response signal 316 that is provided to a loop filter 306, which may be implemented using a low pass filter. The filtered response 318 output by the loop filter 306 is provided to the VCO 308. The output 322 of the VCO 308 is fed back into the phase detector 302 to complete a feedback loop of the PLL.

The PLL may be configured to align the phase of the local reference clock signal to the phase of the received data signal 312. The output 322 of the VCO 308 may be buffered to provide a recovered clock signal 320. The recovered clock signal 320 may be provided to a sampler circuit 310 that is configured to sample or capture data from the received data signal 312. The sampler circuit 310 provides recovered data 330 at its output. The CDR circuit 300 illustrated in FIG. 3 may be configured primarily in the analog domain and is operative to maintain phase alignment, but typically cannot synchronize the frequency of the recovered clock signal 320 with the frequency of the local reference clock.

Figure 4:
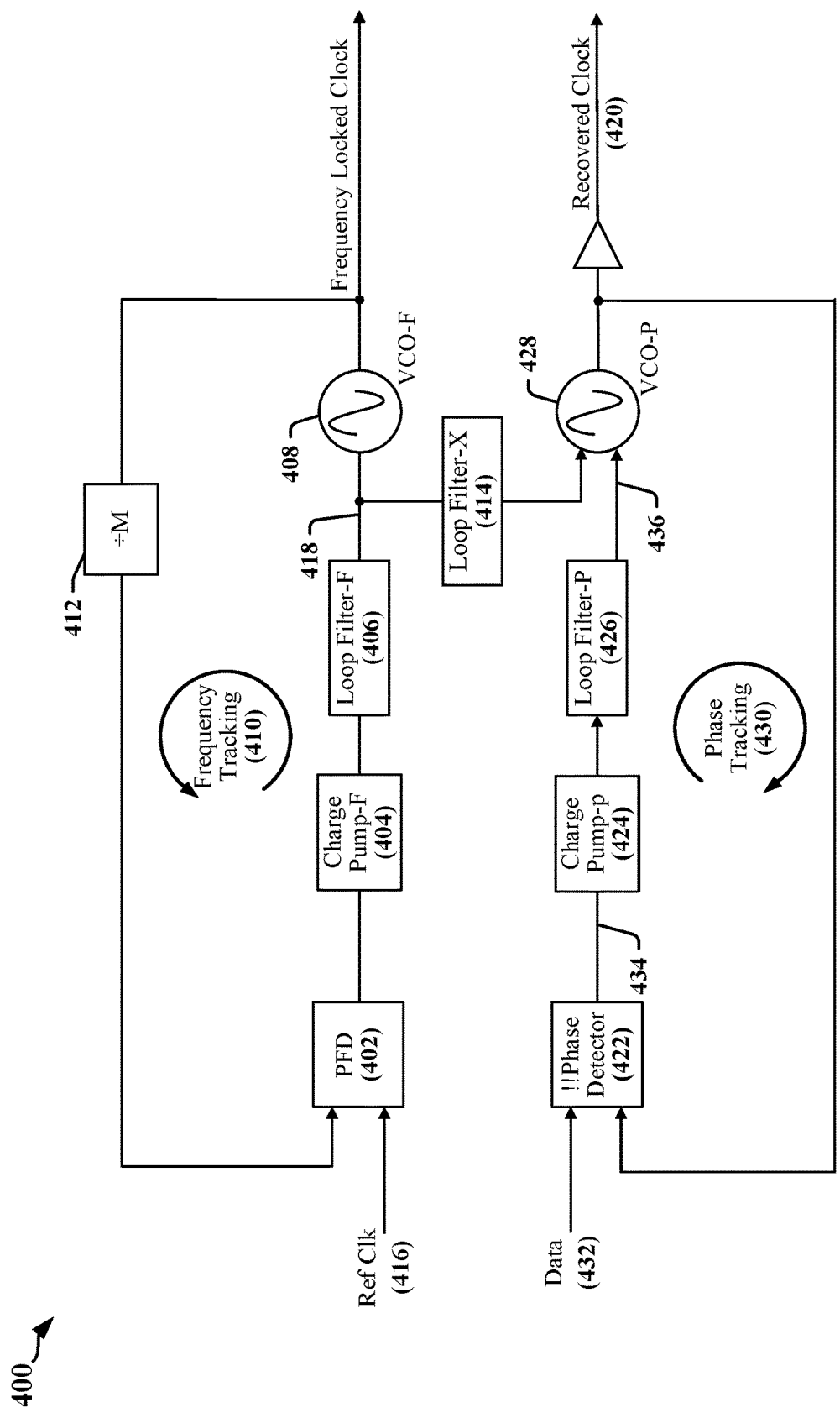
FIG. 4 illustrates a first example of a PLL-based dual-loop CDR circuit.

FIG. 4 illustrates a first example of a dual-loop CDR 400. The dual-loop CDR 400 may be provided in a receiving device such as the receiver 222 of the data communication system 200 illustrated in FIG. 2. In the illustrated dual-loop CDR 400, the received data signal 432 is input to a phase detector 422, which may be a bang-bang phase detector that is provided as part of a phase tracking loop 430. The phase detector 422 tracks the phase of the received data signal 432 with respect to the output of a first voltage-controlled oscillator (VCO-P 428), and generates control signals 434 that are provided to a charge pump 424. In some examples, the control signals 434 include up and down signals. The charge pump 424 provides a phase response signal to a loop filter 426, which may be implemented as a low pass filter. The filtered response 436 output by the loop filter 426 is provided to VCO-P 428. The output of VCO-P 428, which may be used to provide the recovered clock signal 420, is fed back into the phase detector 422 to complete the feedback loop of the phase tracking loop 430. The phase tracking loop 430 may be configured to provide a desired phase relationship between the recovered clock signal 420 and the received data signal 432.

A frequency-tracking loop 410 of the dual-loop CDR 400 receives a reference clock signal 416 that may be generated within the receiving device in some implementations. The reference clock signal 416 is coupled to a first input of a phase and frequency detector circuit 402. The phase and frequency detector circuit 402 detects differences in phase and frequency between the reference clock signal 416 and the output of a second voltage-controlled oscillator (VCO-F 408). The phase and frequency detector circuit 402 generates control signals that are provided to a charge pump 404. In some examples, the control signals include up and down signals. The charge pump 404 provides a response signal to a loop filter 406, which may be implemented as a low pass filter. The filtered response 418 output by the loop filter 406 is provided to VCO-F 408. The output of VCO-F 408 is fed back into a second input of the phase and frequency detector circuit 402 through a divider circuit 412 to complete the feedback loop of the frequency-tracking loop 410. The filtered response 418 output by the loop filter 406 is also provided to VCO-P 428 for the purpose of locking the frequency of the recovered clock signal 420 to the frequency of the reference clock signal 416. The VCO-P 428 may receive a version of the filtered response 418 that has been further filtered by an additional filter 414.

The use of two voltage-controlled oscillators (VCO-F 408 and VCO-P 428) by the dual-loop CDR 400 can result in frequency differences arising between the two loops 410, 430 that can prevent the recovered clock signal 420 achieving phase and/or frequency lock. Certain issues associated with the dual-loop CDR 400 illustrated in FIG. 4 may be avoided or minimized using a dual-loop CDR that includes a single VCO.

Figure 5:
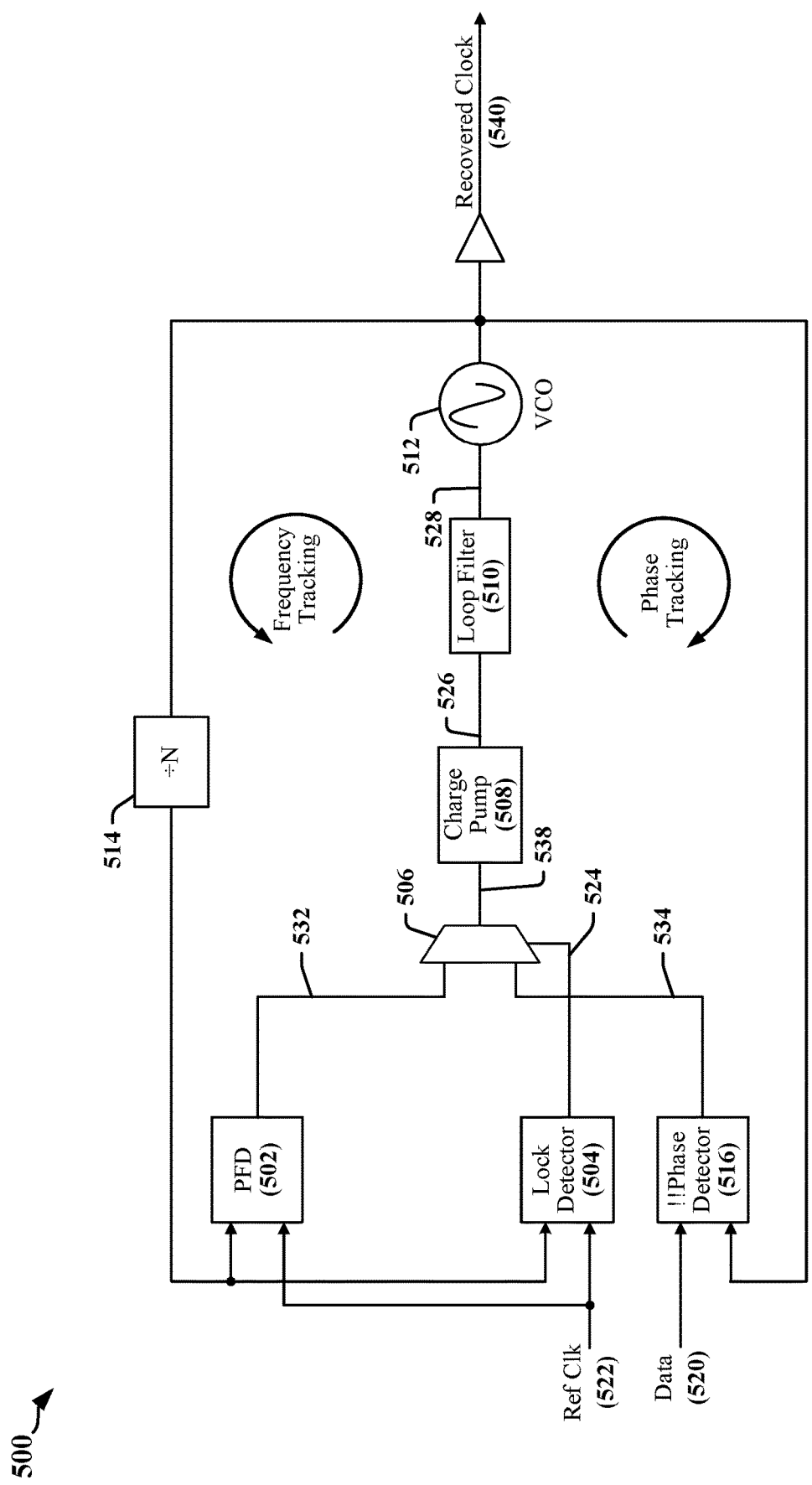
FIG. 5 illustrates a second example of a PLL-based dual-loop CDR circuit.

FIG. 5 illustrates a second example of a dual-loop CDR 500. In this example, the output of a single VCO 512 provides feedback to a frequency-tracking loop and a phase tracking loop. The dual-loop CDR 500 may be provided in a receiving device such as the receiver 222 of the data communication system 200 illustrated in FIG. 2. In the illustrated dual-loop CDR 500, the received data signal 520 is input to a phase detector 516, which may be a bang-bang phase detector and which operates within the phase tracking loop. When the phase tracking loop is controlling the VCO 512, the phase detector 516 tracks the phase of the received data signal 520 with respect to the output of the VCO 512 and generates control signals 534 that are provided to a charge pump 508. The output of the VCO 512 is fed back into the phase detector 516 to complete the phase tracking feedback loop. The phase tracking feedback loop may be configured to align the phase of the recovered clock signal 540 to the phase of the received data signal 520.

The frequency-tracking loop of the dual-loop CDR 500 receives a reference clock signal 522. In some implementations, the reference clock signal 522 may be generated within the receiving device. The reference clock signal 522 is coupled to a first input of a phase and frequency detector circuit 502. The phase and frequency detector circuit 502 detects differences in phase and frequency between the reference clock signal 522 and the output the VCO 512. When the frequency tracking loop is controlling the VCO 512, the phase and frequency detector circuit 502 generates control signals 532 that are provided to a charge pump 508. The output of the VCO 512 is fed back into a second input of the phase and frequency detector circuit 502 through a divider circuit 514 to complete the feedback loop of the frequency tracking loop.

The control signals 538 provided to the charge pump 508 may include up and down signals. The charge pump 508 provides a response signal 526 to a loop filter 510, which may be implemented as a low pass filter. The filtered response 528 output by the loop filter 510 is provided to the VCO 512. The output of VCO 512 may be used to generate the recovered clock signal 540.

A multiplexer 506 may select the control signals 538 that are to be provided to the charge pump 508. The multiplexer 506 selects between the control signals 532 generated by the phase and frequency detector circuit 502 in the frequency tracking loop and the control signals 534 generated by the phase detector 516 in the phase-tracking loop. The multiplexer 506 responds a lock detect signal 524 in order to select between the control signals 532, 534. The lock detect signal 524 is generated by a lock detector circuit 504 and is in a first signaling state when the frequency tracking loop achieves lock and is in a second signaling state when the frequency tracking loop loses lock. The control signals 532 generated by the phase and frequency detector circuit 502 in the frequency tracking loop are selected when the second signaling state is in the lock detect signal 524, enabling the dual-loop CDR 500 to achieve frequency lock. After frequency lock is achieved, the lock detector circuit 504 transitions to the first signaling state and the dual-loop CDR 500 actively tracks phase using the phase-tracking loop.

The dual-loop CDR 500 illustrated in FIG. 5 may be characterized as a sequential dual-loop CDR circuit. The multiplexer 506 limits the operation of the dual-loop CDR 500 such that only one of the phase-tracking loop and the frequency tracking loop can control the VCO 512 at any time such that frequency and phase locks are achieved sequentially. Each loop controls the VCO 512, in turn, by controlling the charge pump 508. The phase loop bandwidth and stability are both determined by the loop filter and tradeoffs may be needed to find a compromise rather than an optimum operating point for the dual-loop CDR 500. The dual-loop CDR 500 typically suffers from a long overall locking time due to the long time required to obtain frequency lock.

Figure 6:
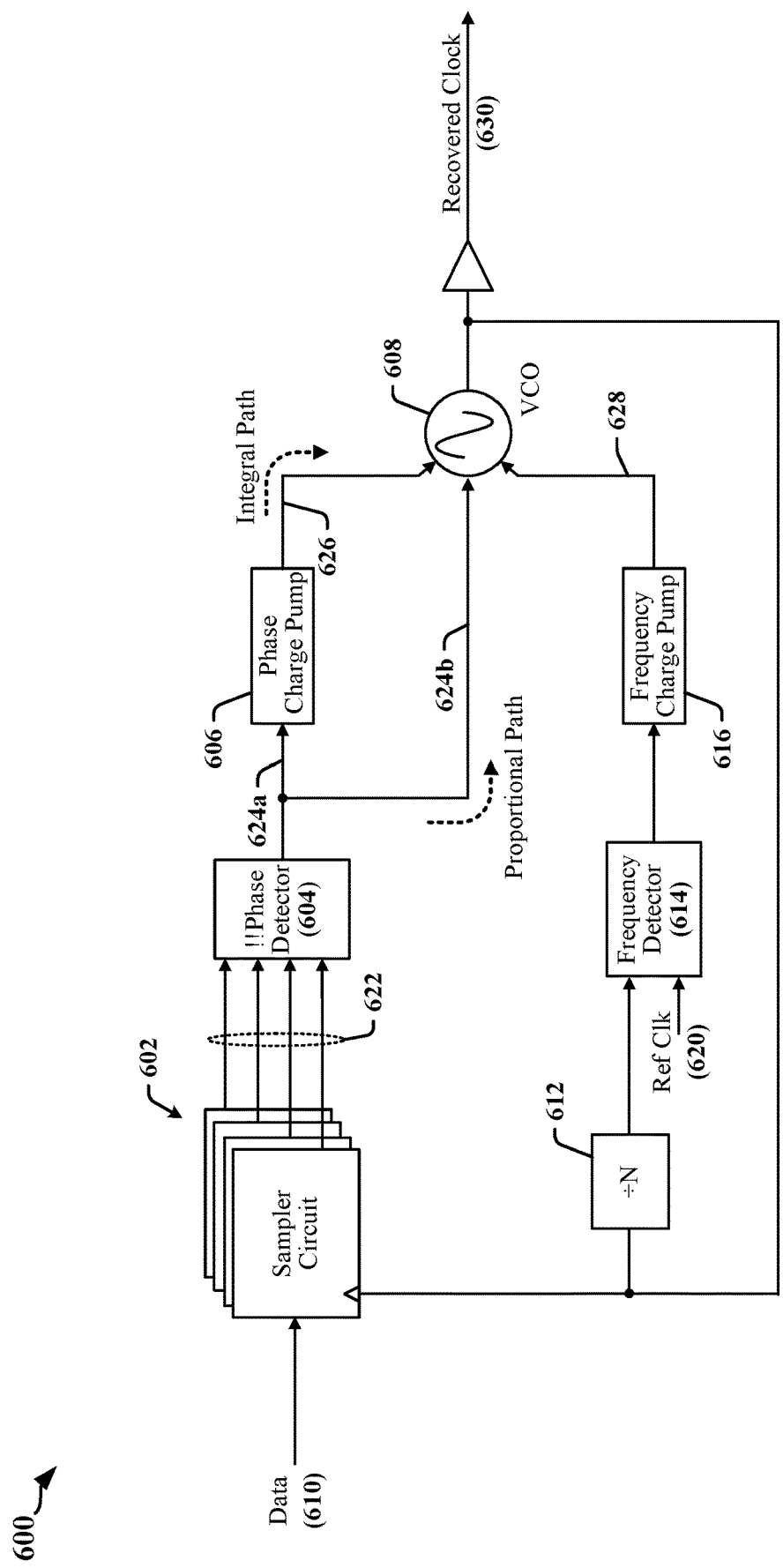
FIG. 6 illustrates a third example of a PLL-based dual-loop CDR circuit.

FIG. 6 illustrates a third example of a dual-loop CDR 600. In this example, the output of a single VCO 608 provides feedback to a frequency-tracking loop and to a phase tracking loop. The dual-loop CDR 600 may be provided in a receiving device such as the receiver 222 of the data communication system 200 illustrated in FIG. 2. In the illustrated dual-loop CDR 600, a received data signal 610 is input to sampler circuits 602 that are clocked by the output of the VCO 608. In the illustrated example, the VCO 608 provides a four-phase clock to the sampler circuits 602, which include four circuits that each contribute to a sampler output 622 provided to a phase detector circuit 604. The phase detector circuit 604 may be a bang-bang phase detector. The phase detector circuit 604 generates an output that represents the phase difference between the output of the VCO 608 and the received data signal 610 in accordance with the state of the sampler output 622. The output generated by the phase detector circuit 604 may be a multibit signal that includes control signals 624a that are provided to a charge pump 606, and control signals 624b that are provided to the VCO 608. The output 626 of the charge pump 606 is included in an "integral path" that is used to control the VCO 608. The control signals 624b that directly control the VCO 608 may follow what may be referred to as a "proportional path." A multibit output of the VCO 608 is fed back into the sampler circuits 602 to complete the phase tracking feedback loop. The phase tracking feedback loop may be configured to align the phase of a recovered clock signal 630 with the phase of the received data signal 610.

A frequency-tracking loop of the dual-loop CDR 600 receives a reference clock signal 620. In some implementations, the reference clock signal 620 may be generated within the receiving device. The reference clock signal 620 is coupled to a first input to a frequency detector circuit 614. The frequency detector circuit 614 detects differences in frequency between the reference clock signal 620 and the output the VCO 608. The frequency detector circuit 614 generates a difference signal that is provided to a charge pump 606 that generates an output 628 used to control the VCO 608. The output of the VCO 608 is fed back into the phase and frequency detector circuit 614 through a divider circuit 612 to complete the feedback loop of the frequency tracking loop.

The dual-loop CDR 600 illustrated in FIG. 6 may be characterized as a sequential dual-loop CDR circuit with split proportional and integral paths in the phase tracking loop. Each loop controls the VCO 608 through different and corresponding charge pumps 606, 616. The dual-loop CDR 600 typically suffers from a long frequency locking time, and a small proportional gain in the phase tracking loop. The loop bandwidth is determined by the proportional gain, and the small proportional gain limits the operable frequency range (pull-in range) in which the phase tracking loop can achieve phase lock. Additionally, the small proportional gain results in slow phase locking performance. The proportional gain and associated loop bandwidth can be increased by increasing the current provided in the proportional path. However, increasing the current provided to the VCO 608 through the proportional path can be expected to cause control voltages within the VCO 608 to drift, resulting in loss of frequency lock.

Certain aspects of this disclosure relate to a CDR circuit that can acquire frequency lock and phase lock more rapidly while reducing phase jitter while operating in steady state conditions after frequency and phase locks have been acquired. In one aspect, certain issues associated with the use of a bang-bang phase detector are addressed. For example, a conventional bang-bang phase detector is typically unable to capture frequency offsets or establish frequency lock. Cycle slippage may occur if a frequency offset is beyond the pull-in range of the phase tracking loop, which may be determined or correlated with the CDR loop bandwidth. In some instances, the CDR may lock onto an incorrect frequency.

A CDR configured in accordance with certain aspects of this disclosure can provide an enhanced pull-in range for the phase loop and can reduce the time needed to obtain phase lock by increasing PLL bandwidth during a transition period in which frequency and phase lock are established. The loop bandwidth can be changed after lock has been achieved in order to optimize jitter performance in steady state operation. CDR locking is assisted using a frequency locking loop (FLL) is added.

Figure 7:
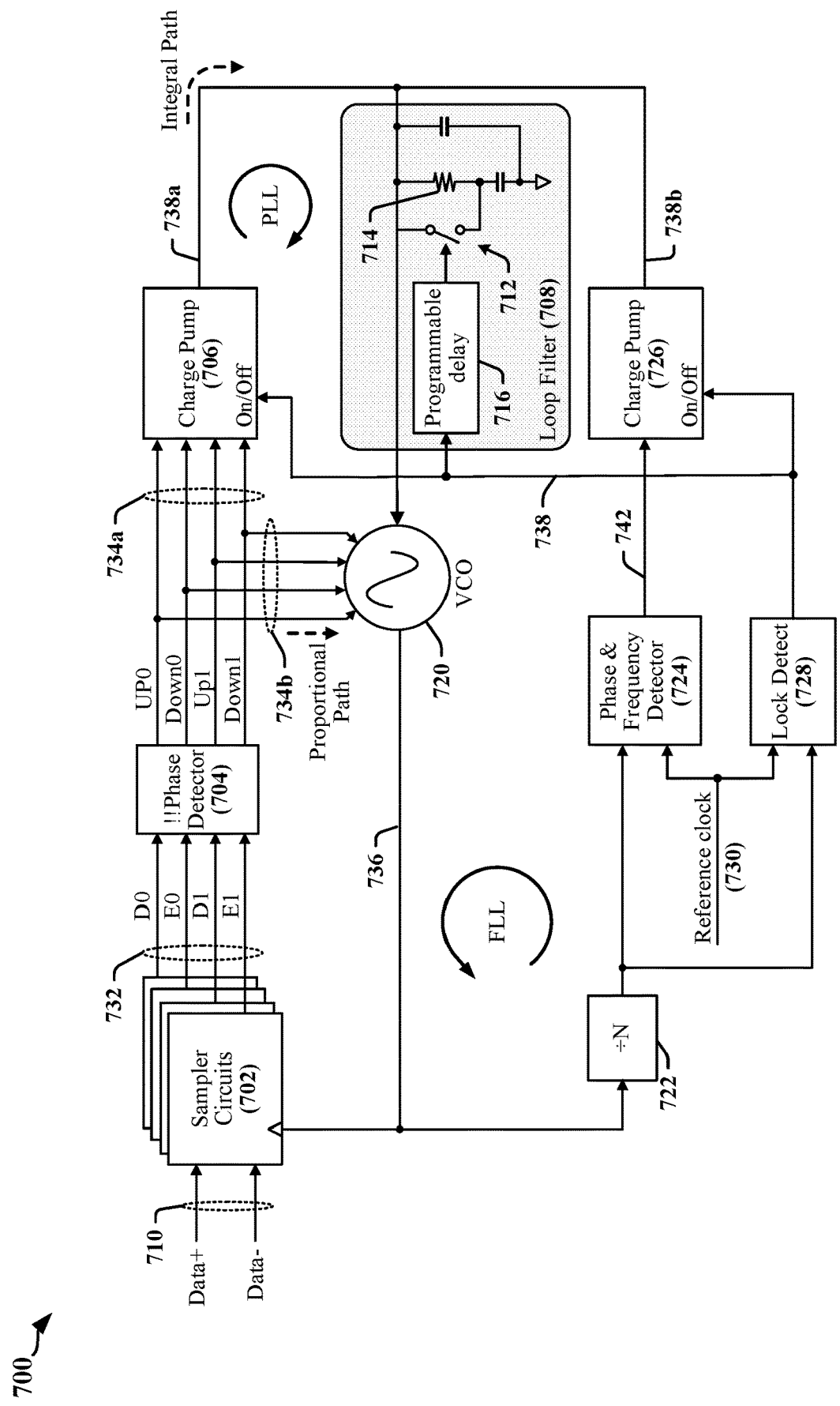
FIG. 7 illustrates an example of a PLL-based dual-loop CDR circuit configured in accordance with certain aspects of this disclosure.

FIG. 7 illustrates an example of a dual-loop CDR 700 configured in accordance with certain aspects of this disclosure. A VCO 720 provides feedback to FLL and PLL sections of the dual-loop CDR 700. The dual-loop CDR 700 may be provided in a receiving device such as the receiver 222 of the data communication system 200 illustrated in FIG. 2. In the illustrated example, a received data signal 710 is input to sampler circuits 702 that are clocked by the output of the VCO 720. The received data signal 710 may be provided to the sampler circuits 702 as a differential signal. The VCO 720 may be configured to provide the sampler circuits 702 with multiple phases of a clock signal. In the illustrated example, the sampler circuits 702 include four circuits that each contribute to a sampler output 732 that is provided to a phase detector circuit 704. The phase detector circuit 704 may be a bang-bang phase detector. The phase detector circuit 704 generates an output that represents phase difference between the output of the VCO 720 and the received data signal 710, based on information provided in the sampler output.

The output generated by the phase detector circuit 704 may be a multibit signal that includes first control signals 734*a* that are provided to a first charge pump 706 and second control signals 734*b* that are provided to the VCO 720. In some implementations, at least some signals in the first control signals 734*a* are included in the second control signals 734*b*. The first charge pump 706 is included in an integral path and provides control signals 738*a* to the VCO 720. The VCO 720 is also controlled directly through a proportional path using the second control signals 734*b* generated by the phase detector circuit 704. The VCO 720 may be controlled using a combination of the integral path and the proportional path in certain modes of operation. The integral path also includes a loop filter 708. An output 736 of the VCO 720 is fed back into the sampler circuits 702 to complete a PLL. The PLL may be configured to align the phase of the output 736 of the VCO 720 to the phase of the received data signal 710.

The FLL of the dual-loop CDR 700 receives a reference clock signal 730. In some implementations, the reference clock signal 730 may be generated within the receiving device. The reference clock signal 730 is coupled to a first input to a phase and frequency detector circuit 724. The phase and frequency detector circuit 724 detects differences in frequency between the reference clock signal 730 and the output 736 the VCO 720. The phase and frequency detector circuit 724 generates a difference signal 742 that is provided to a second charge pump 726. The second charge pump 726 provides an output 738*b* used to control the VCO 720 in certain modes of operation. The output of the VCO 720 is fed back into the phase and frequency detector circuit 724 through a divider circuit 722 to complete the feedback loop of the FLL. The divider circuit 722 may be configured to divide the frequency of the output of the VCO 720 by a number determined based on design or application requirements. In one example, the divider circuit 722 may be configured to divide the frequency of the output of the VCO 720 by 16.

The loop filter 708 may be configured as a low pass filter that includes a resistor-capacitor (RC) network. At least one resistor 714 in the RC network can be short-circuited using a switch 712. In the illustrated example, the switch 712 short-circuits the resistor 714 when activated. An activation signal 738 is asserted when a lock detection circuit 728 detects frequency lock in the PLL section of the dual-loop CDR 700. The lock detection circuit 728 continuously monitors the frequency of the output 736 of the VCO 720. When the VCO 720 produces an output frequency that matches a target frequency, control of the VCO 720 passes from the FLL loop to the PLL loop. In the illustrated example, the activation signal 738 selects between the first charge pump 706 and the second charge pump 726 to control the VCO 720.

According to certain aspects of this disclosure, certain characteristics of the loop filter 708 may be adjusted during transitions between modes in which the FLL controls the VCO 720 and modes in which the PLL controls the VCO 720. In one example, the loop filter 708 may be configured to obtain a desired proportional gain during such transitions. The proportional gain may be controlled by configuring the resistance value of the resistor 714 and by delaying the change with respect to the assertion of the activation signal 738. In the illustrated example, the resistor 714 can be bypassed in response to the assertion of the activation signal 738, thereby reducing resistance in the RC network. The activation signal 738 is delayed by a programmable delay element 716 to provide a delayed activation of the switch 712 and thereby delay bypassing the resistor 714.

The resistance value of the resistor 714 may be selected to provide a desired proportional gain while frequency lock is acquired. The assertion of the activation signal 738 when frequency lock is detected by the lock detection circuit 728 disables the second charge pump 726 and enables the first charge pump 706, thereby transferring control of the VCO 720 from the FLL to the PLL. The delay provided by the programmable delay element 716 maintains the proportional gain provided before frequency lock for a configured period of time in order to increase pull-in range for the PLL. The increased pull-in range can accelerate acquisition of phase lock. The switch 712 is closed and the resistor 714 is bypassed when the activation signal 738 has propagated through the programmable delay element 716. The delay in activating the switch can avoid or minimize disturbances of VCO control voltages during the transference of control of the VCO 720 from the FLL to the PLL. In steady state conditions, the activation signal 738 is asserted while frequency lock is maintained, providing improved jitter performance attributable to the reduction in proportional gain obtained when the switch 712 is closed and the resistor 714 is bypassed.

Figure 8:
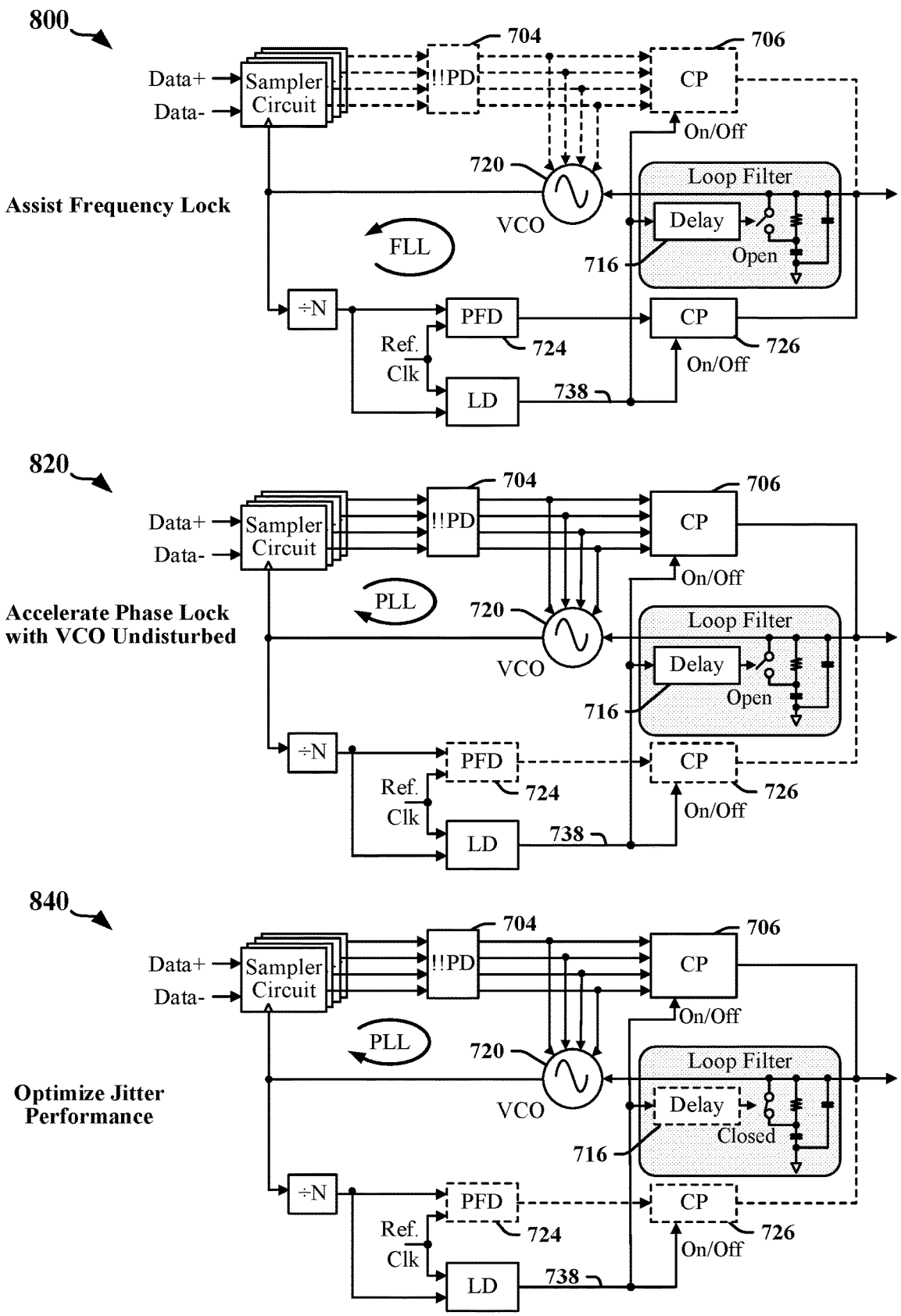
FIG. 8 illustrates different configurations of a CDR that is operated in accordance aspects of this disclosure.

FIG. 8 illustrates different configurations 800, 820, 840 of the dual-loop CDR 700 when operated in accordance aspects of this disclosure. In a first configuration 800, the activation signal 738 is not asserted while the dual-loop CDR 700 is seeking frequency lock and the FLL controls the VCO 720. The first charge pump 706 and, in some implementations, the phase detector circuit 704 are disabled while the second charge pump 726 and the phase and frequency detector 724 are enabled. The switch 712 is open. In a second configuration 820, the activation signal 738 has been asserted after the dual-loop CDR 700 has acquired frequency lock, transferring control of the VCO 720 from the FLL to the PLL. The first charge pump 706 and the phase detector circuit 704 are enabled while the second charge pump 726 and, in some implementations, the phase and frequency detector 724 are disabled. The activation signal 738 has not yet propagated through the programmable delay element 716 and the switch 712 remains open. In a third configuration 840, the activation signal 738 remains asserted while the dual-loop CDR 700 maintains frequency lock. The VCO 720 is controlled by the PLL. The first charge pump 706 and the phase detector circuit 704 are enabled while the second charge pump 726 and, in some implementations, the phase and frequency detector 724 are disabled. The activation signal 738 has propagated through the programmable delay element 716 and the switch 712 is closed. The programmable delay element 716 may be bypassed to enable quick recovery in the event of loss of frequency lock.

In aspect of this disclosure, the programmable delay element 716 is configured to limit the time period during which proportional gain is increased after FLL lock has been acquired. The programmable delay element 716 enables the PLL to operate with increased proportional gain for a configured duration of time after frequency lock is detected. The delay provided by the programmable delay element 716 may be selected to enable the dual-loop CDR 700 to acquire phase lock before the proportional gain in the dual-loop CDR 700 is reduced. The programmable delay element 716 operates to provide an initial increased pull-in range and phase locking speed for the PLL after frequency lock has been acquired.

The dual-loop CDR 700 can operate with optimized jitter performance under steady state conditions when frequency and phase are locked and the switch 712 has been closed. Improvements in jitter performance may be observed when the switch 712 is closed and the resistor 714 is bypassed. Jitter may include transmitter-independent jitter and data dependent jitter caused by inter symbol interference (ISI) and crosstalk, as well as jitter attributable to the receiver circuits.

Increased proportional gain can be achieved without increasing the proportional path current within the VCO 720. Increasing the proportional path current within the VCO 720 during phase lock acquisition can cause loss of frequency lock in conventional systems.

Figure 9:
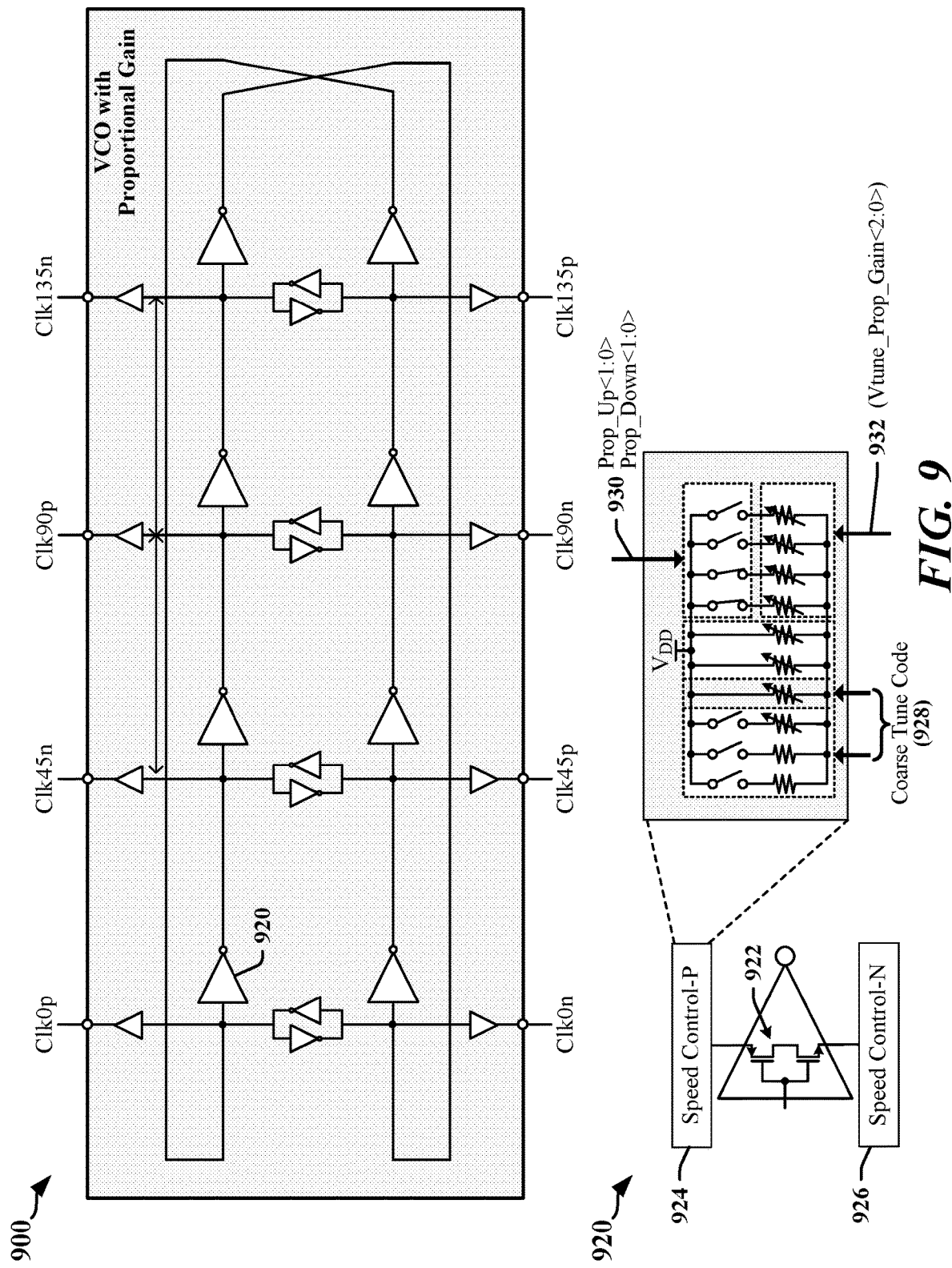
FIG. 9 illustrates an example of a programmable VCO that may be deployed in a CDR configured in accordance with certain aspects of this disclosure.

FIG. 9 illustrates an example of a programmable VCO 900 that may be deployed in a CDR circuit configured in accordance with certain aspects of this disclosure. The programmable VCO 900 is configured to output multiple phases of a target clock signal. In the illustrated example, the phases are separated by 45°. The programmable VCO 900 may be configured to respond to control signals received from a bang-bang phase detector, and to code words determined or configured during calibration. In the illustrated example, one or more of the inverters (e.g., inverter 920) may be implemented with speed control circuits 924, 926. The speed control circuits 924, 926 may control biasing of a driver circuit 922 in the inverter 920. For convenience, one of the speed control circuits 924 is illustrated in more detail. Speed control circuit 924 is coupled between the driver circuit 922 and a positive voltage power supply (here, VDD), while the other speed control circuit 926 is coupled between the driver circuit 922 and a negative voltage power supply.

The speed control circuit 924 includes multiple programmable resistors and switches. The speed control circuit 924 may respond to a coarse tuning code 928 that may be configured during calibration. The coarse tuning code 928 may configure the programmable VCO 900 to operate within a desired range of frequencies, for example. The coarse tuning code 928 may cause the speed control circuit 924 to selectively add or remove one or more resistances to the biasing circuit for the driver circuit 922. In the illustrated example, a resistance may be removed by closing a switch in order to bypass a resistor, and a resistance may be added by causing a switch to be opened in order to add a resistor to the biasing circuit. The coarse tuning code 928 may define a resistance value for one or more programmable resistors, including programmable resistors that are controlled by a switch.

In some implementations, the speed control circuit 924 may respond to control signals received from a bang-bang phase detector. For example, up and down signals 930 may cause one or more switches to be opened, closed or left unaffected. In the illustrated example, each of the switches responsive to the up and down signals 930 may cause a programmable resistor to be added to the biasing circuit for the driver circuit 922. These latter programmable resistors may be configured by a codeword 932 that defines the step values of resistance value that are added to increase or decrease proportional gain.

Figure 10:
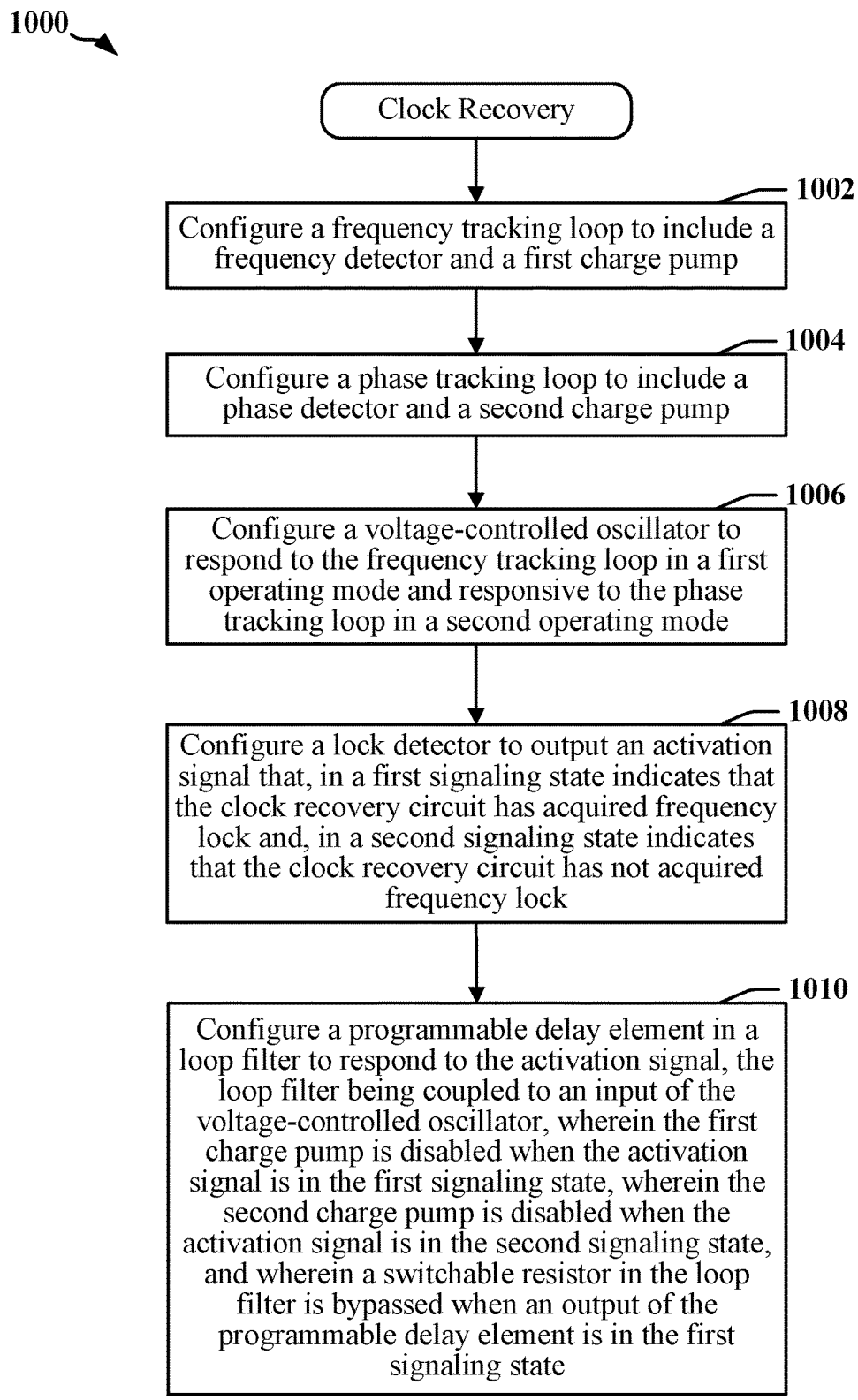
FIG. 10 is a flowchart illustrating a method for recovering a clock signal in accordance with certain aspects of this disclosure.

FIG. 10 is a flowchart illustrating an example of a method 1000 for recovering a clock signal in accordance with certain aspects of this disclosure. The method 1000 may be implemented using a clock and data recovery circuit in an IC device that generates a recovered clock signal to be used for sampling received data signals. In one example, the transmitting IC device and the receiving IC device are embodied in die on a chip carrier. The method 1000 may relate to certain aspects of this disclosure as described in regard to FIGS. 7-9.

In one example, the method 1000 may be implemented using a clock and data recovery circuit that includes a voltage-controlled oscillator, a first charge pump having an output coupled to a first control input of the voltage-controlled oscillator, a frequency detector having an input coupled to an output of the voltage-controlled oscillator and an output coupled to an input of the first charge pump, and a frequency lock detector having a first input coupled to the output of the voltage-controlled oscillator, a second input that receives a reference clock signal, and an output that drives an enable input of the first charge pump. The clock and data recovery circuit may further include a second charge pump having an output coupled to the first control input of the voltage-controlled oscillator, a phase detector having an input that receives outputs from a plurality of data sampling circuits and a multibit output coupled to an input of the second charge pump and to a second control input of the voltage-controlled oscillator, and a loop filter coupled to the first control input of the voltage-controlled oscillator. The loop filter may be implemented using a tunable resistor, a programmable delay element triggered by the output of the frequency lock detector, and a switch configured to bypass the tunable resistor when indicated by an output of the programmable delay element. The data sampling circuits may be clocked by the output of the voltage-controlled oscillator or by a signal derived from the output of the voltage-controlled oscillator.

At block 1002, a frequency tracking loop may be configured to include a frequency detector and a first charge pump. At block 1004, a phase tracking loop may be configured to include a phase detector and a second charge pump. At block 1006, a voltage-controlled oscillator may be configured to respond to the frequency tracking loop in a first operating mode and to respond to the phase tracking loop in a second operating mode. At block 1008, a lock detector may be configured to output an activation signal that, in a first signaling state indicates that the clock recovery circuit has acquired frequency lock and, in a second signaling state indicates that the clock recovery circuit has not acquired frequency lock. At block 1010, a programmable delay element in a loop filter may be configured to respond to the activation signal, the loop filter being coupled to an input of the voltage-controlled oscillator. The first charge pump may be disabled when the activation signal is in the first signaling state. The second charge pump may be disabled when the activation signal is in the second signaling state. A switchable resistor in the loop filter may be bypassed when an output of the programmable delay element is in the first signaling state. The method may include calibrating or configuring a resistance value of the switchable resistor to obtain a desired proportional gain during transitions between the first operating mode and the second operating mode. The phase detector may be a bang-bang phase detection circuit that outputs up and down signals.

In some implementations, the frequency detector may be configured to provide the first charge pump a control signal that is representative of a difference in frequency between a reference clock signal and a divided output of the voltage-controlled oscillator. The control signal provided to the first charge pump may be configured to cause the first charge pump to configure a control voltage within the voltage-controlled oscillator.

In certain implementations, the phase detector is configured to provide the second charge pump a control signal representative of a difference in phase between a data signal and an output of the voltage-controlled oscillator. The control signal provided to the second charge pump may be configured to cause the second charge pump to configure a control voltage within the voltage-controlled oscillator. The control signal representative of the difference in phase between the data signal and the output of the voltage-controlled oscillator may be provided directly to the voltage-controlled oscillator to tune the voltage-controlled oscillator.

In some implementations, the programmable delay element is configured with a delay operable to delay bypassing the switchable resistor until the clock recovery circuit has acquired phase lock. The switchable resistor may have a resistance value configured to increase a loop gain of the clock recovery circuit.

Some implementation examples are described in the following numbered clauses:

1. A clock recovery circuit, comprising: a frequency tracking loop including a frequency detector and a first charge pump; a phase tracking loop including a phase detector and a second charge pump; a voltage-controlled oscillator responsive to the frequency tracking loop in a first operating mode and responsive to the phase tracking loop in a second operating mode; a lock detector configured to output an activation signal that, in a first signaling state indicates that the clock recovery circuit has acquired frequency lock and, in a second signaling state indicates that the clock recovery circuit has not acquired frequency lock; and a loop filter coupled to an input of the voltage-controlled oscillator and including a switchable resistor and a programmable delay element responsive to the activation signal, wherein the first charge pump is disabled when the activation signal is in the first signaling state, wherein the second charge pump is disabled when the activation signal is in the second signaling state, and wherein the switchable resistor is bypassed when an output of the programmable delay element is in the first signaling state.

2. The clock recovery circuit as described in clause 1, wherein the frequency detector is configured to provide the first charge pump a control signal that is representative of a difference in frequency between a reference clock signal and a divided output of the voltage-controlled oscillator.

3. The clock recovery circuit as described in clause 2, wherein the control signal provided to the first charge pump is configured to cause the first charge pump to configure a control voltage within the voltage-controlled oscillator.

4. The clock recovery circuit as described in any of clauses 1-3, wherein the phase detector is configured to provide the second charge pump a control signal representative of a difference in phase between a data signal and an output of the voltage-controlled oscillator.

5. The clock recovery circuit as described in clause 4, wherein the control signal provided to the second charge pump is configured to cause the second charge pump to configure a control voltage within the voltage-controlled oscillator.

6. The clock recovery circuit as described in clause 4 or clause 5, wherein the control signal provided to the second charge pump is further provided directly to the voltage-controlled oscillator and is configured to tune the voltage-controlled oscillator.

7. The clock recovery circuit as described in any of clauses 1-6, wherein the programmable delay element is configured with a delay configured to delay bypassing the switchable resistor until the clock recovery circuit has acquired phase lock.

8. The clock recovery circuit as described in any of clauses 1-7, wherein the switchable resistor has a resistance value configured to increase a loop gain of the clock recovery circuit.

9. The clock recovery circuit as described in any of clauses 1-8, wherein the switchable resistor has a resistance value that is configured or calibrated to obtain desired proportional gain during transitions between the first operating mode and the second operating mode.

10. The clock recovery circuit as described in any of clauses 1-9, wherein the phase detector comprises a bang-bang phase detection circuit that outputs up and down signals.

11. A method for recovering a clock signal, comprising: configuring a frequency tracking loop to include a frequency detector and a first charge pump; configuring a phase tracking loop to include a phase detector and a second charge pump; configuring a voltage-controlled oscillator to respond to the frequency tracking loop in a first operating mode and to respond to the phase tracking loop in a second operating mode; configuring a lock detector to output an activation signal that, in a first signaling state indicates that the clock recovery circuit has acquired frequency lock and, in a second signaling state indicates that the clock recovery circuit has not acquired frequency lock; and configuring a programmable delay element in a loop filter to respond to the activation signal, the loop filter being coupled to an input of the voltage-controlled oscillator, wherein the first charge pump is disabled when the activation signal is in the first signaling state, wherein the second charge pump is disabled when the activation signal is in the second signaling state, and wherein a switchable resistor in the loop filter is bypassed when an output of the programmable delay element is in the first signaling state.

12. The method as described in clause 11, further comprising: configuring the frequency detector to provide the first charge pump a control signal that is representative of a difference in frequency between a reference clock signal and a divided output of the voltage-controlled oscillator.

13. The method as described in clause 12, wherein the control signal provided to the first charge pump is configured to cause the first charge pump to configure a control voltage within the voltage-controlled oscillator.

14. The method as described in any of clauses 11-13, further comprising: configuring the phase detector to provide the second charge pump a control signal representative of a difference in phase between a data signal and an output of the voltage-controlled oscillator.

15. The method as described in clause 14, wherein the control signal provided to the second charge pump is configured to cause the second charge pump to configure a control voltage within the voltage-controlled oscillator.

16. The method as described in clause 14 or clause 15, further comprising: providing the control signal representative of the difference in phase between the data signal and the output of the voltage-controlled oscillator directly to the voltage-controlled oscillator to tune the voltage-controlled oscillator.

17. The method as described in any of clauses 11-16, further comprising: configuring the programmable delay element with a delay operable to delay bypassing the switchable resistor until the clock recovery circuit has acquired phase lock.

18. The method as described in any of clauses 11-17, wherein the switchable resistor has a resistance value configured to increase a loop gain of the clock recovery circuit.

19. The method as described in any of clauses 11-18, further comprising: configuring a resistance value of the switchable resistor to obtain a desired proportional gain during transitions between the first operating mode and the second operating mode.

20. The method as described in any of clauses 11-19, wherein the phase detector comprises a bang-bang phase detection circuit that outputs up and down signals.

21. An apparatus, comprising: means for tracking a frequency of a signal, including a frequency tracking loop that includes a frequency detector and a first charge pump; means for tracking phase of the signal, including a phase tracking loop that includes a phase detector and a second charge pump; means for generating a clock signal, including a voltage-controlled oscillator configured to respond to the frequency tracking loop in a first operating mode and to respond to the phase tracking loop in a second operating mode; means for detecting that the frequency tracking loop has acquired frequency lock, including a lock detector configured to output an activation signal that, in a first signaling state indicates that the clock recovery circuit has acquired frequency lock and, in a second signaling state indicates that the clock recovery circuit has not acquired frequency lock; and means for delaying the activation signal, including a programmable delay element provided in a loop filter that responds to the activation signal, the loop filter being coupled to an input of the voltage-controlled oscillator, wherein the first charge pump is disabled when the activation signal is in the first signaling state, wherein the second charge pump is disabled when the activation signal is in the second signaling state, and wherein a switchable resistor in the loop filter is bypassed when an output of the programmable delay element is in the first signaling state.

22. The apparatus as described in clause 21, wherein the means for tracking the frequency of the signal is configured to provide the first charge pump a control signal that is representative of a difference in frequency between a reference clock signal and a divided output of the voltage-controlled oscillator.

23. The apparatus as described in clause 22, wherein the control signal provided to the first charge pump is configured to cause the first charge pump to configure a control voltage within the voltage-controlled oscillator.

24. The apparatus as described in any of clauses 21-23, wherein the phase detector is configured to provide the second charge pump a control signal representative of a difference in phase between a data signal and an output of the voltage-controlled oscillator.

25. The apparatus as described in clause 24, wherein the control signal provided to the second charge pump is configured to cause the second charge pump to configure a control voltage within the voltage-controlled oscillator.

26. The apparatus as described in clause 24 or clause 25, wherein the control signal representative of the difference in phase between the data signal and the output of the voltage-controlled oscillator is provided directly to the voltage-controlled oscillator to tune the voltage-controlled oscillator.

27. The apparatus as described in any of clauses 21-26, wherein the programmable delay element is configured with a delay operable to delay bypassing the switchable resistor until the clock recovery circuit has acquired phase lock.

28. The apparatus as described in any of clauses 21-27, wherein the switchable resistor has a resistance value configured to increase a loop gain of the clock recovery circuit.

29. The apparatus as described in any of clauses 21-28, wherein the switchable resistor has a resistance value that is configured or calibrated to obtain a desired proportional gain during transitions between the first operating mode and the second operating mode.

30. A clock and data recovery circuit comprising: a voltage-controlled oscillator; a first charge pump having an output coupled to a first control input of the voltage-controlled oscillator; a frequency detector having an input coupled to an output of the voltage-controlled oscillator and an output coupled to an input of the first charge pump; a frequency lock detector having a first input coupled to the output of the voltage-controlled oscillator, a second input that receives a reference clock signal, and an output that drives an enable input of the first charge pump; a second charge pump having an output coupled to the first control input of the voltage-controlled oscillator; a phase detector having an input that receives outputs from a plurality of data sampling circuits and a multibit output coupled to an input of the second charge pump and to a second control input of the voltage-controlled oscillator; and a loop filter coupled to the first control input of the voltage-controlled oscillator/The loop filter may include a tunable resistor; a programmable delay element triggered by the output of the frequency lock detector; and a switch configured to bypass the tunable resistor when indicated by an output of the programmable delay element; and a loop filter coupled to the first control input of the voltage-controlled oscillator, the loop filter including: a tunable resistor; a programmable delay element triggered by the output of the frequency lock detector; and a switch that is configured to bypass the tunable resistor when indicated by an output of the programmable delay element, wherein the data sampling circuits are clocked by the output of the voltage-controlled oscillator.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The present disclosure is provided to enable any person skilled in the art to make or use aspects of the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A clock recovery circuit, comprising:
a frequency tracking loop including a frequency detector and a first charge pump;
a phase tracking loop including a phase detector and a second charge pump;
a voltage-controlled oscillator responsive to the frequency tracking loop in a first operating mode and responsive to the phase tracking loop in a second operating mode;
a lock detector configured to output an activation signal that, in a first signaling state indicates that the clock recovery circuit has acquired frequency lock and, in a second signaling state indicates that the clock recovery circuit has not acquired frequency lock; and
a loop filter coupled to an input of the voltage-controlled oscillator and including a switchable resistor and a programmable delay element responsive to the activation signal,
wherein the first charge pump is disabled when the activation signal is in the first signaling state,
wherein the second charge pump is disabled when the activation signal is in the second signaling state, and
wherein the switchable resistor is bypassed when an output of the programmable delay element is in the first signaling state.

2. The clock recovery circuit of claim 1, wherein the frequency detector is configured to provide the first charge pump a control signal that is representative of a difference in frequency between a reference clock signal and a divided output of the voltage-controlled oscillator.

3. The clock recovery circuit of claim 2, wherein the control signal provided to the first charge pump is configured to cause the first charge pump to configure a control voltage within the voltage-controlled oscillator.

4. The clock recovery circuit of claim 1, wherein the phase detector is configured to provide the second charge pump a control signal representative of a difference in phase between a data signal and an output of the voltage-controlled oscillator.

5. The clock recovery circuit of claim 4, wherein the control signal provided to the second charge pump is configured to cause the second charge pump to configure a control voltage within the voltage-controlled oscillator.

6. The clock recovery circuit of claim 4, wherein the control signal provided to the second charge pump is further provided directly to the voltage-controlled oscillator and is configured to tune the voltage-controlled oscillator.

7. The clock recovery circuit of claim 1, wherein the programmable delay element is configured with a delay configured to delay bypassing the switchable resistor until the clock recovery circuit has acquired phase lock.

8. The clock recovery circuit of claim 1, wherein the switchable resistor has a resistance value configured to increase a loop gain of the clock recovery circuit.

9. The clock recovery circuit of claim 1, wherein the switchable resistor has a resistance value that is configured or calibrated to obtain a desired proportional gain during transitions between the first operating mode and the second operating mode.

10. The clock recovery circuit of claim 1, wherein the phase detector comprises a bang-bang phase detection circuit that outputs up and down signals.

11. A method for recovering a clock signal, comprising:
configuring a frequency tracking loop to include a frequency detector and a first charge pump in a clock recovery circuit;
configuring a phase tracking loop to include a phase detector and a second charge pump in the clock recovery circuit;
configuring a voltage-controlled oscillator to respond to the frequency tracking loop in a first operating mode and to respond to the phase tracking loop in a second operating mode;

configuring a lock detector to output an activation signal that, in a first signaling state indicates that the clock recovery circuit has acquired frequency lock and, in a second signaling state indicates that the clock recovery circuit has not acquired frequency lock; and configuring a programmable delay element in a loop filter to respond to the activation signal, the loop filter being coupled to an input of the voltage-controlled oscillator, wherein the first charge pump is disabled when the activation signal is in the first signaling state, wherein the second charge pump is disabled when the activation signal is in the second signaling state, and wherein a switchable resistor in the loop filter is bypassed when an output of the programmable delay element is in the first signaling state.

12. The method of claim 11, further comprising:
configuring the frequency detector to provide the first charge pump a control signal that is representative of a difference in frequency between a reference clock signal and a divided output of the voltage-controlled oscillator.

13. The method of claim 12, wherein the control signal provided to the first charge pump is configured to cause the first charge pump to configure a control voltage within the voltage-controlled oscillator.

14. The method of claim 11, further comprising:
configuring the phase detector to provide the second charge pump a control signal representative of a difference in phase between a data signal and an output of the voltage-controlled oscillator.

15. The method of claim 14, wherein the control signal provided to the second charge pump is configured to cause the second charge pump to configure a control voltage within the voltage-controlled oscillator.

16. The method of claim 14, further comprising:
providing the control signal representative of the difference in phase between the data signal and the output of the voltage-controlled oscillator directly to the voltage-controlled oscillator to tune the voltage-controlled oscillator.

17. The method of claim 11, further comprising:
configuring the programmable delay element with a delay operable to delay bypassing the switchable resistor until the clock recovery circuit has acquired phase lock.

18. The method of claim 11, wherein the switchable resistor has a resistance value configured to increase a loop gain of the clock recovery circuit.

19. The method of claim 11, further comprising:
configuring a resistance value of the switchable resistor to obtain a desired proportional gain during transitions between the first operating mode and the second operating mode.

20. The method of claim 11, wherein the phase detector comprises a bang-bang phase detection circuit that outputs up and down signals.

21. An apparatus, comprising:
means for tracking a frequency of a signal, including a frequency tracking loop that includes a frequency detector and a first charge pump;

means for tracking phase of the signal, including a phase tracking loop that includes a phase detector and a second charge pump;

means for generating a clock signal, including a voltage-controlled oscillator configured to respond to the frequency tracking loop in a first operating mode and to respond to the phase tracking loop in a second operating mode;

means for detecting that the apparatus has acquired frequency lock, including a lock detector configured to output an activation signal that, in a first signaling state indicates that the apparatus has acquired frequency lock and, in a second signaling state indicates that the apparatus has not acquired frequency lock; and means for delaying the activation signal, including a programmable delay element provided in a loop filter that responds to the activation signal, the loop filter being coupled to an input of the voltage-controlled oscillator, wherein the first charge pump is disabled when the activation signal is in the first signaling state, wherein the second charge pump is disabled when the activation signal is in the second signaling state, and wherein a switchable resistor in the loop filter is bypassed when an output of the programmable delay element is in the first signaling state.

22. The apparatus of claim 21, wherein the means for tracking the frequency of the signal is configured to provide the first charge pump a control signal that is representative of a difference in frequency between a reference clock signal and a divided output of the voltage-controlled oscillator.

23. The apparatus of claim 22, wherein the control signal provided to the first charge pump is configured to cause the first charge pump to configure a control voltage within the voltage-controlled oscillator.

24. The apparatus of claim 21, wherein the phase detector is configured to provide the second charge pump a control signal representative of a difference in phase between a data signal and an output of the voltage-controlled oscillator.

25. The apparatus of claim 24, wherein the control signal provided to the second charge pump is configured to cause the second charge pump to configure a control voltage within the voltage-controlled oscillator.

26. The apparatus of claim 24, wherein the control signal representative of the difference in phase between the data signal and the output of the voltage-controlled oscillator is provided directly to the voltage-controlled oscillator to tune the voltage-controlled oscillator.

27. The apparatus of claim 21, wherein the programmable delay element is configured with a delay operable to delay bypassing the switchable resistor until the phase tracking loop has acquired phase lock.

28. The apparatus of claim 21, wherein the switchable resistor has a resistance value configured to increase a loop gain in the frequency tracking loop or in the phase tracking loop.

29. The apparatus of claim 21, wherein the switchable resistor has a resistance value that is configured or calibrated to obtain a desired proportional gain during transitions between the first operating mode and the second operating mode.

30. A clock and data recovery circuit comprising:
a voltage-controlled oscillator;
a first charge pump having an output coupled to a first control input of the voltage-controlled oscillator;
a frequency detector having an input coupled to an output of the voltage-controlled oscillator and an output coupled to an input of the first charge pump;
a frequency lock detector having a first input coupled to the output of the voltage-controlled oscillator, a second input that receives a reference clock signal, and an output that drives an enable input of the first charge pump;
a second charge pump having an output coupled to the first control input of the voltage-controlled oscillator;

a phase detector having an input that receives outputs from a plurality of data sampling circuits and a multibit output coupled to an input of the second charge pump and to a second control input of the voltage-controlled oscillator; and
a loop filter coupled to the first control input of the voltage-controlled oscillator, the loop filter including:
a tunable resistor;
a programmable delay element triggered by the output of the frequency lock detector; and
a switch that is configured to bypass the tunable resistor when indicated by an output of the programmable delay element,
wherein the data sampling circuits are clocked by the output of the voltage-controlled oscillator.

* * * * *